United States Patent
Guan

(10) Patent No.: US 8,363,405 B2
(45) Date of Patent: Jan. 29, 2013

(54) HEAT DISSIPATION DEVICE

(75) Inventor: Zhi-Bin Guan, Taipei Hsien (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 191 days.

(21) Appl. No.: 12/905,441

(22) Filed: Oct. 15, 2010

(65) Prior Publication Data

US 2012/0044649 A1   Feb. 23, 2012

(30) Foreign Application Priority Data

Aug. 19, 2010   (TW) ................. 99127664 A

(51) Int. Cl.
*H05K 7/20*   (2006.01)

(52) U.S. Cl. ........ 361/704; 361/690; 361/719; 257/727; 165/80.3; 165/185

(58) Field of Classification Search .......... None
See application file for complete search history.

(56) References Cited

U.S. PATENT DOCUMENTS

| | | | | |
|---|---|---|---|---|
| 5,365,402 A | * | 11/1994 | Hatada et al. | 361/699 |
| 6,154,363 A | * | 11/2000 | Chang | 361/699 |
| 6,462,952 B1 | * | 10/2002 | Ubukata et al. | 361/719 |
| 6,622,782 B2 | * | 9/2003 | Malhammar | 165/46 |
| 7,019,976 B1 | * | 3/2006 | Ahmad et al. | 361/704 |
| 7,063,127 B2 | * | 6/2006 | Gelorme et al. | 165/80.2 |
| 7,219,713 B2 | * | 5/2007 | Gelorme et al. | 165/80.4 |
| 7,408,780 B2 | * | 8/2008 | Karidis et al. | 361/709 |
| 7,581,585 B2 | * | 9/2009 | Tuma | 165/276 |
| 7,881,072 B2 | * | 2/2011 | Dibene et al. | 361/803 |
| 8,004,846 B2 | * | 8/2011 | Okada et al. | 361/721 |

* cited by examiner

*Primary Examiner* — Boris Chervinsky
(74) *Attorney, Agent, or Firm* — Altis Law Group, Inc.

(57) ABSTRACT

A heat dissipation device is used for heat dissipating for an electronic element. The heat dissipation device includes a heat sink and a buffer arranged between the heat sink and the electronic element. The buffer is made of elastic and thermally conductive material.

13 Claims, 4 Drawing Sheets

HEAT DISSIPATION DEVICE

BACKGROUND

1. Technical Field

The present disclosure relates to a heat dissipation device.

2. Description of Related Art

A heat dissipation device usually includes a heat sink directly attached to an electronic element. As a result, the electronic element may be damaged if the heat dissipation device suffers any impact once attached, such as often happens during assembly and transportation of a machine using the heat dissipation device.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
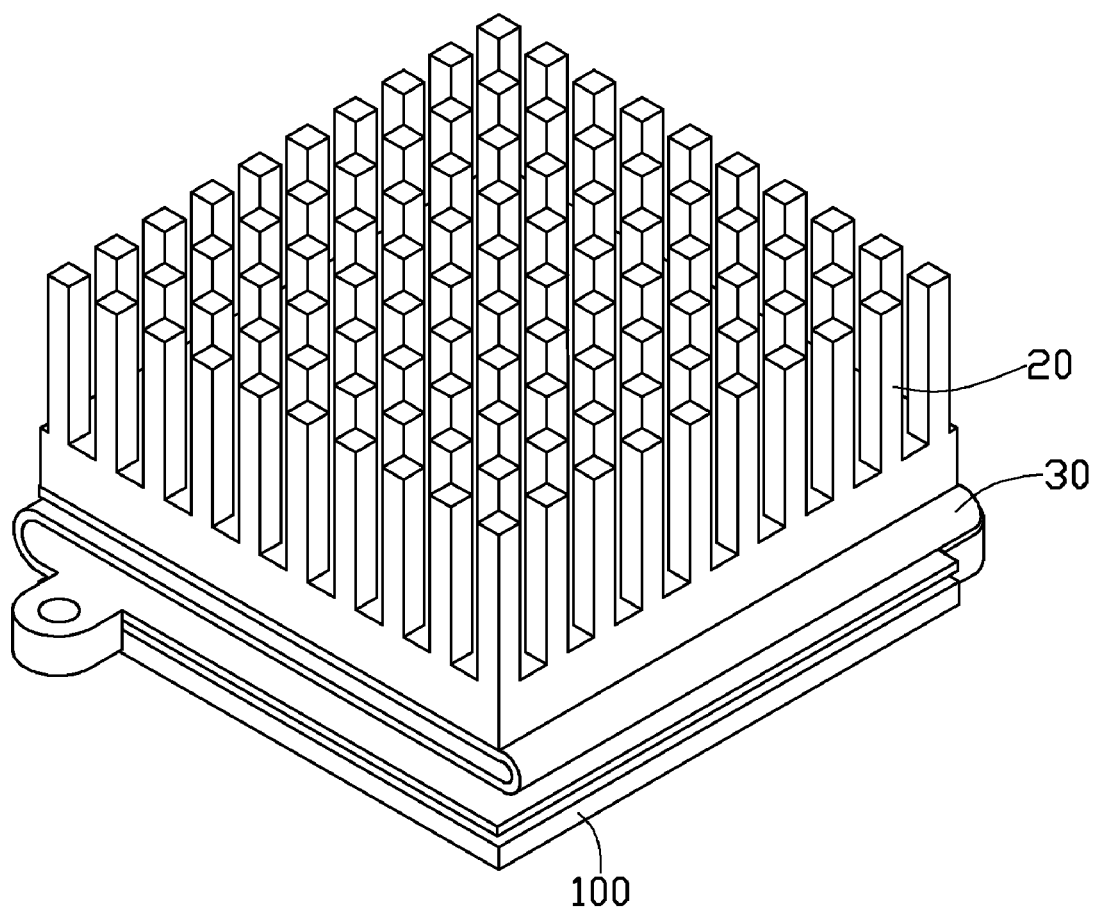
FIG. 1 is an assembled, isometric view of an embodiment of a heat dissipation device.
Figure 2:
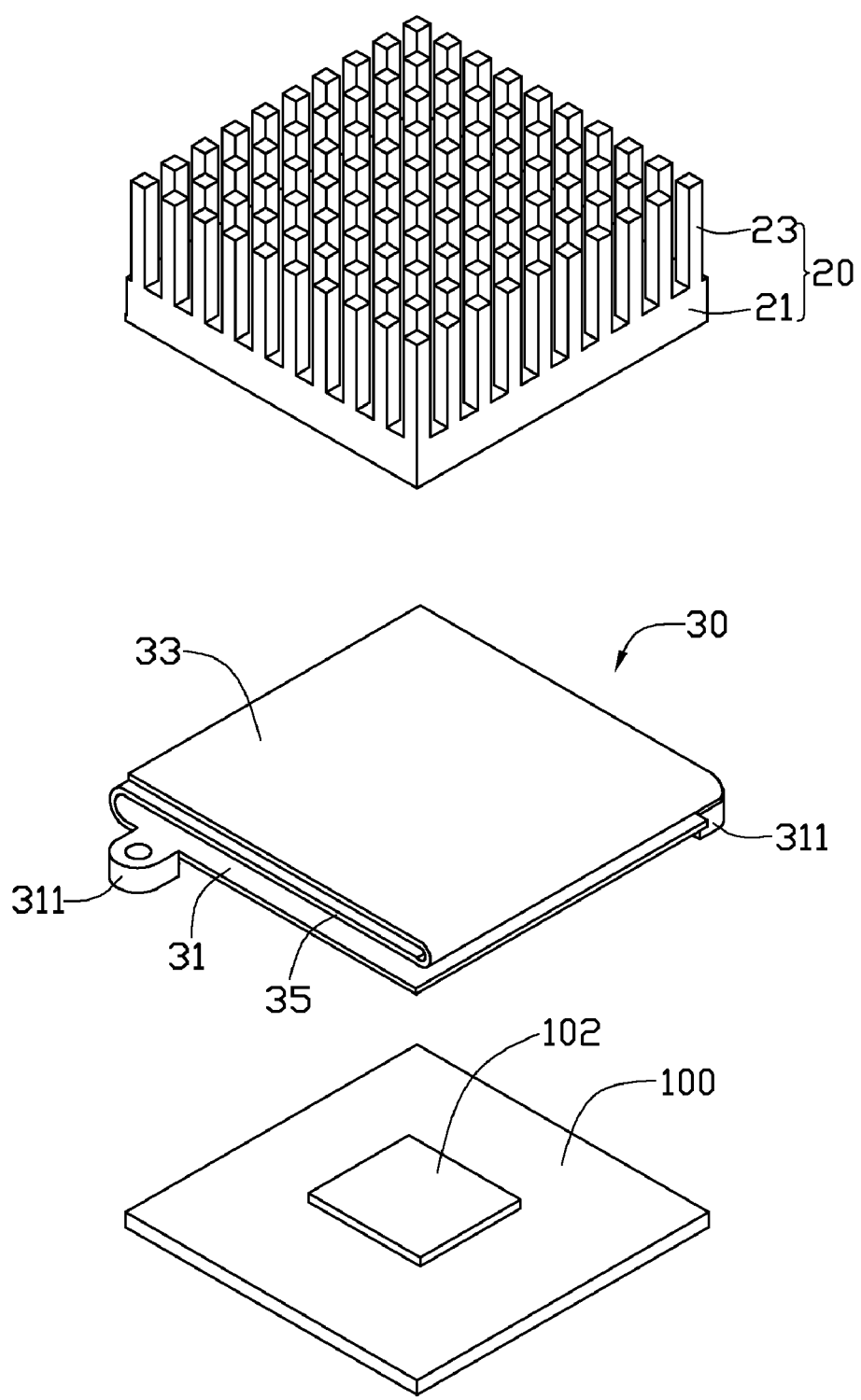
FIG. 2 is an exploded, isometric view of the heat dissipation device of FIG. 1.

Referring to FIGS. 1 and 2, an exemplary embodiment of a heat dissipation device used for dissipating heat generated by an electronic element 102 mounted on a board 100. The electronic element 102 may be a central processing unit. The heat dissipation device includes a heat sink 20 and a buffer 30.

The heat sink 20 includes a base 21 and a number of fins 23 extending from the base 21.

The buffer 30 is made of elastic and thermally conductive material, such as copper and/or silver. The buffer 30 is substantially Z-shaped. Obviously, the buffer 30 may be M-shaped or other appropriate shape. The buffer 30 includes a first plate 31, a second plate 33 substantially parallel to the first plate 31, and a buffering portion 35 formed between the first and second plates 31 and 33. Two mounting portions 311 extend from the first plate 31 diagonally, for mounting the buffer 30 to the board 100. The first plate 31 is in tight contact with the electronic element 102.

Figure 3:
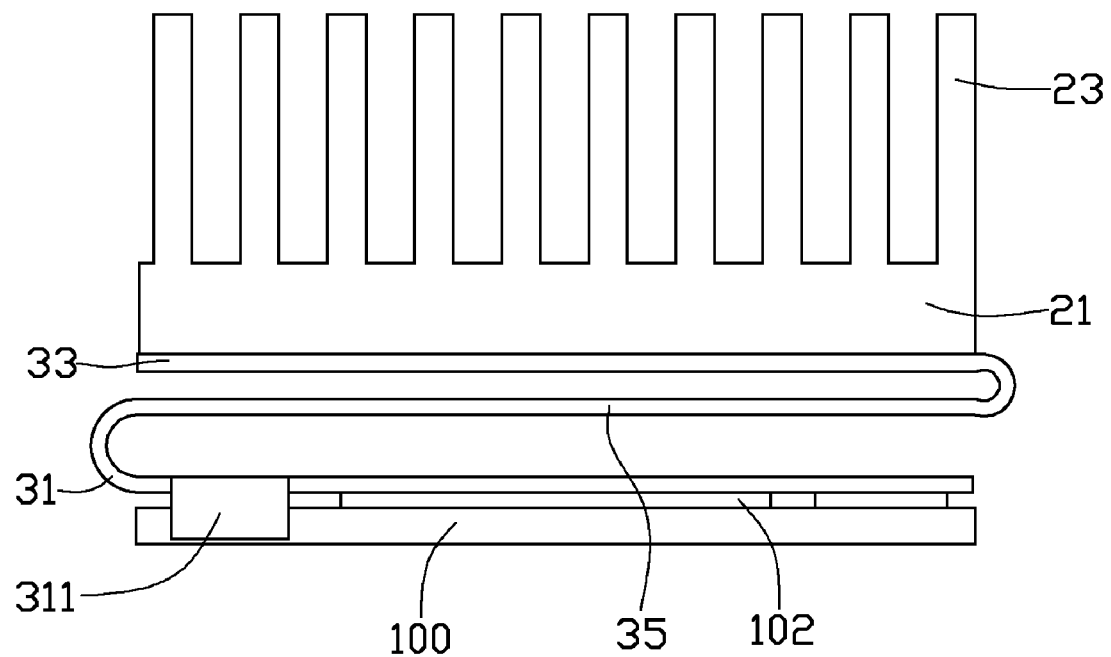
FIG. 3 is a side view of the heat dissipation device of FIG. 1.

Referring to FIG. 3, the second plate 33 of the buffer 30 is connected to the base 21 of the heat sink 20 opposite to the fins 23, by jointing or riveting for example.

Figure 4:
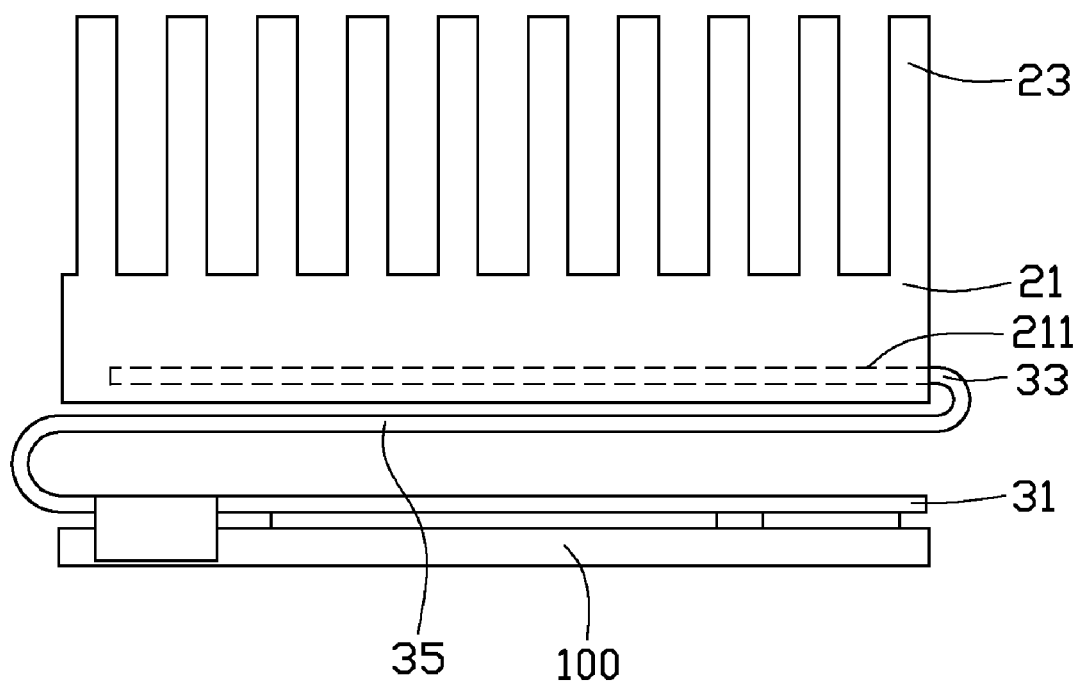
FIG. 4 is a side view of another embodiment of the heat dissipation device.

Referring to FIG. 4, in another embodiment, the base 21 of the heat sink 20 defines a channel 211, the second plate 33 of the buffer 30 may insert in the channel 211 to connect the buffer 30 to the base 21 of the heat sink 20. Obviously, in other embodiments, the buffer 30 and the base 21 of the heat sink 20 may be integrated during manufacture.

The buffer 30 may reduce damage to the electronic element 102 due to excessive vibration or impact to the heat sink 20.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A heat dissipation device used for heat dissipating for an electronic element, the heat dissipation device comprising:
    a heat sink comprising a base and a plurality of fins extending from the base; and
    a buffer made of elastic and thermally conductive material, wherein the buffer comprises a first plate attached to the electronic element, a second plate connected to the base of the heat sink opposite to the plurality of fins, and a buffering portion connected between the first and second plates;
    wherein two mounting portions extend from the first plate of the buffer, for mounting the buffer to a board on which the electronic element is attached.

2. The heat dissipation device of claim 1, wherein the buffer is made of copper and/or silver.

3. The heat dissipation device of claim 1, wherein the buffer is substantially Z-shaped.

4. The heat dissipation device of claim 1, wherein the second plate of the buffer is connected to the base of the heat sink by jointing or riveting.

5. The heat dissipation device of claim 1, wherein the base of the heat sink defines a channel, the second plate of the buffer is inserted in the channel to connect the buffer to the base of the heat sink.

6. An assembly comprising:
    a board;
    an electronic element set on the board;
    a buffer made of elastic and thermally conductive material, wherein the buffer comprises a first plate attached to the electronic element, a second plate, and a buffering portion connected between the first and second plates, two mounting portions are formed from the first plate of the buffer, for mounting the buffer to the board and sandwiching the electronic element together with the board; and
    a heat sink comprising a base and a plurality of fins extending up from a top of the base;
    wherein the second plate is fixed to a bottom of the base of the heat sink.

7. The assembly of claim 6, wherein the buffer is made of copper and/or silver.

8. The assembly of claim 6, wherein the buffer is substantially Z-shaped.

9. The assembly of claim 6, wherein the second plate of the buffer is connected to the base of the heat sink by jointing or riveting.

10. The assembly of claim 6, wherein the base of the heat sink defines a channel, the second plate of the buffer is inserted in the channel to connect the buffer to the base of the heat sink.

11. An assembly comprising:
    a board;
    an electronic element set on the board; and
    a heat sink comprising a base, a plurality of fins extending up from the base, and a buffer, wherein the buffer is made of elastic and thermally conductive material, the buffer comprises a first plate attached to the electronic element, a second plate extending down from the base and integrated with the base during manufacture, and a buffering portion connected between the first and second plates, two mounting portions extend from the first plate of the buffer, mount the buffer to the board and sandwich the electronic element between the board and the first plate.

12. The assembly of claim 11, wherein the buffer is made of copper and/or silver.

13. The assembly of claim 11, wherein the buffer is substantially Z-shaped.

* * * * *